(12) United States Patent
Papasouliotis et al.

(10) Patent No.: US 7,223,707 B1
(45) Date of Patent: May 29, 2007

(54) DYNAMIC RAPID VAPOR DEPOSITION PROCESS FOR CONFORMAL SILICA LAMINATES

(75) Inventors: George D. Papasouliotis, Sunnyvale, CA (US); Jeff Tobin, Mountain View, CA (US); Ron Rulkens, Milpitas, CA (US); Dennis M. Hausmann, Los Gatos, CA (US); Adrianne K. Tipton, Pleasanton, CA (US); Raihan M. Tarafdar, San Jose, CA (US); Bunsen Nie, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 74 days.

(21) Appl. No.: 11/027,480

(22) Filed: Dec. 30, 2004

(51) Int. Cl.
*H01L 21/00* (2006.01)
(52) U.S. Cl. .................. 438/800; 438/778
(58) Field of Classification Search .......... 438/778, 438/781, 800, 907, 909, 935
See application file for complete search history.

(56) References Cited

U.S. PATENT DOCUMENTS

| | | | |
|---|---|---|---|
| 5,314,724 | A | 5/1994 | Tsukune et al. |
| 5,525,550 | A | 6/1996 | Kato |
| 5,527,561 | A | 6/1996 | Dobson |
| 5,597,395 | A | 1/1997 | Bocko et al. |
| 5,705,028 | A | 1/1998 | Matsumoto |
| 5,985,770 | A | 11/1999 | Sandhu et al. |
| 6,030,881 | A | 2/2000 | Papasouliotis et al. |
| 6,102,993 | A | 8/2000 | Bhandari et al. |
| 6,133,160 | A | 10/2000 | Komiyama et al. |
| 6,184,143 | B1 | 2/2001 | Ohashi et al. |
| 6,300,219 | B1 | 10/2001 | Doan et al. |
| 6,316,063 | B1 | 11/2001 | Andideh et al. |
| 6,335,261 | B1 | 1/2002 | Natzle et al. |

(Continued)

FOREIGN PATENT DOCUMENTS

JP   5-308071 A   11/1993

(Continued)

OTHER PUBLICATIONS

Dennis Michael Hausmann, "Atomic Layer Deposition of Metal Oxide Thin Films," A thesis presented by, Harvard University, 186 pages, Jul. 2002.

(Continued)

*Primary Examiner*—Phuc T. Dang
(74) *Attorney, Agent, or Firm*—Beyer Weaver LLP

(57) ABSTRACT

A method for using ALD and RVD techniques in semiconductor manufacturing to produce a smooth nanolaminate dielectric film, in particular for filling structures with doped or undoped silica glass, uses dynamic process conditions. A dynamic process using variable substrate (e.g., wafer) temperature, reactor pressure and/or reactant partial pressure, as opposed to static process conditions through various cycles, can be used to minimize film roughness and improve gap fill performance and film properties via the elimination or reduction of seam occurrence. Overall film roughness can be reduced by operating the initial growth cycle under conditions which optimize film smoothness, and then switching to conditions that will enhance conformality, gap fill and film properties for the subsequent process cycles. Film deposition characteristics can be changed by modulating one or more of a number of process parameters including wafer temperature, reactor pressure, reactant partial pressure and combinations of these.

36 Claims, 7 Drawing Sheets

U.S. PATENT DOCUMENTS

| | | | |
|---|---|---|---|
| 6,352,943 | B2 | 3/2002 | Maeda et al. |
| 6,352,953 | B1 | 3/2002 | Seki et al. |
| 6,372,669 | B2 | 4/2002 | Sandhu et al. |
| 6,503,330 | B1 | 1/2003 | Sneh et al. |
| 6,511,399 | B2 | 1/2003 | Mc Collum Etchason et al. |
| 6,511,539 | B1 | 1/2003 | Raaijmakers |
| 6,531,377 | B2 | 3/2003 | Knorr et al. |
| 6,534,395 | B2 | 3/2003 | Werkhoven et al. |
| 6,534,802 | B1 | 3/2003 | Schuegraf |
| 6,540,838 | B2 | 4/2003 | Sneh et al. |
| 6,551,339 | B2 | 4/2003 | Gavronsky |
| 6,586,349 | B1 | 7/2003 | Jeon et al. |
| 6,780,789 | B1 | 8/2004 | Yu et al. |
| 6,784,101 | B1 * | 8/2004 | Yu et al. .................. 438/666 |
| 6,802,944 | B2 | 10/2004 | Ahmad et al. |
| 6,861,334 | B2 | 3/2005 | Raaijmakers et al. |
| 6,867,152 | B1 * | 3/2005 | Hausmann et al. ......... 438/778 |
| 6,908,862 | B2 | 6/2005 | Li et al. |
| 2001/0049205 | A1 | 12/2001 | Sandhu et al. |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0157781 | A1 | 8/2003 | Macneil et al. |
| 2004/0004247 | A1 | 1/2004 | Forbes et al. |
| 2004/0043149 | A1 | 3/2004 | Gordon et al. |
| 2004/0043569 | A1 * | 3/2004 | Ahn et al. ................. 438/287 |
| 2004/0044127 | A1 | 3/2004 | Okubo et al. |
| 2004/0079728 | A1 | 4/2004 | Mungekar et al. |
| 2004/0102031 | A1 | 5/2004 | Kloster et al. |
| 2004/0203254 | A1 | 10/2004 | Conley et al. |
| 2004/0206267 | A1 | 10/2004 | Sambasivan et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2006/0038293 | A1 | 2/2006 | Rueger et al. |

FOREIGN PATENT DOCUMENTS

| | | |
|---|---|---|
| JP | 2004-256479 | 9/2004 |
| WO | WO02/27063 | 4/2002 |
| WO | WO03/083167 | 10/2003 |

OTHER PUBLICATIONS

Hausmann et al., "Rapid Vapor Deposition of Highly Conformal Silica Nanolaminates;" Science, vol. 308, Oct. 2002, 5 pages.

Gordon et al., "A Kinetic Model for Step Coverage by Atomic Layer Deposition in Narrow Holes or Trenches", Chemical Vapor Deposition 2003, 9, No. 2, pp. 73-78.

Ritala et al., "Atomic Layer Deposition", Handbook of Thin Films Materials, vol. 1, 2002, pp. 103-159.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35 μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146(3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atomospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon Flowfill vs FHDP", Novellus Systems, Inc., pp. 1-12.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,198, filed Mar. 9, 2005, pp. 1-31.

Cho et al., "Hydroxyl Bond Removal and Film Densification Method for Oxide Films Using Microwave Post Treatment", Novellus Systems, Inc., Appln. No. Not yet assigned, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

U.S. Office Action mailed Dec. 7, 2005, from U.S. Appl. No. 10/874,808.

U.S. Office Action mailed Feb. 24, 2006, from U.S. Appl. No. 11/077,108.

U.S. Office Action mailed Mar. 24, 2006, from U.S. Appl. No. 10/975,028.

U.S. Office Action mailed May 23, 2006, from U.S. Appl. No. 11/077,198.

U.S. Office Action mailed May 24, 2006, from U.S. Appl. No. 11/026,284.

U.S. Office Action mailed May 31, 2006, from U.S. Appl. No. 11/026,563.

U.S. Office Action mailed Apr. 25, 2006, from U.S. Appl. No. 11/021,558.

U.S. Office Action mailed May 8, 2006, from U.S. Appl. No. 11/327,668.

* cited by examiner

DYNAMIC RAPID VAPOR DEPOSITION PROCESS FOR CONFORMAL SILICA LAMINATES

BACKGROUND OF THE INVENTION

This invention pertains to methods for forming thin dielectric films. More specifically, the invention pertains to methods of depositing a conformal film of dielectric material on a semiconductor device with a high degree of surface smoothness particularly suited to high aspect ratio gap fill applications.

Conformal, uniform dielectric films have many applications in semiconductor manufacturing. In the fabrication of sub-micron integrated circuits (ICs) several layers of dielectric film are deposited. Four such layers are shallow trench isolation (STI), premetal dielectric (PMD), inter-metal dielectric (IMD) and interlayer dielectric (ILD). All four of these layers require silicon dioxide films that fill features of various sizes and have uniform film thicknesses across the wafer.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

A related technique, referred to as rapid surface-catalyzed vapor deposition (RVD) processing, sometimes also referred to as Pulsed Deposition Layer processing (PDL), is another alternative. RVD is similar to ALD in that reactant gases are introduced alternately over the substrate surface, but in RVD the silicon oxide film can grow more thickly due to the use of a particular class of transition metal containing precursors that catalyze the reaction.

Thus, RVD methods allow for rapid film growth similar to using CVD methods but with the film conformality of ALD methods.

In the previously mentioned dielectric film applications, many of the critical features are filled after just three or four RVD cycles (each depositing approximately 150 Å), so it becomes critically important that the first of these cycles deposit a uniformly thin and smooth film. However, the first cycle is often rough and non-uniform due to poor nucleation on the substrate. For a discussion of this difficulty, see Hausmann, D., Gordon, R (2002), Surface Morphology and Crystallinity Control in the Atomic Layer Deposition (ALD) of Hafnium and Zirconium Oxide Thin Films, Journal of Crystal Growth, 249, 251–261, which is incorporated by reference herein for all purposes. Poor nucleation can dramatically increase surface roughness.

The conformal nature of the process results in the formation of seams in gap fill applications. Upon anneal and film densification, seams will expand and may result in voids forming into the dielectric layer. Film roughness is one of the factors contributing to the formation of seams. What is therefore needed are improved methods for producing silica films with greatly reduced surface roughness using RVD or ALD techniques to improve the gap fill performance of these processes.

SUMMARY OF THE INVENTION

The present invention provides a method for using ALD and RVD techniques in semiconductor manufacturing to produce a smooth dielectric film, in particular for filling structures with doped or undoped silica glass. It relates to a process for depositing conformal nanolaminate dielectric (e.g., silicon dioxide) films for IMD, PMD, or STI gap fill applications. In gap fill applications, the conformal nature of the deposition process results in the formation of seams, which need to be eliminated to ensure device performance. The local film roughness of RVD, which can be modulated by deposition temperature and pressure is a contributing factor in the formation of seams in the layer. A dynamic process using variable substrate (e.g., wafer) temperature, reactor pressure, and/or reactant partial pressure, as opposed to static process conditions through various cycles, can be used to minimize film roughness and improve gap fill performance and film properties via the elimination or reduction of seam occurrence.

This method involves two principal operations: 1) exposing the substrate surface to a metal-containing precursor (e.g., a transition metal, such as aluminum, containing precursor for RVD) to form a substantially saturated surface of the metal-containing precursor; and 2) exposing the substrate surface to a silicon-containing precursor. Operations 1) and 2) are repeated a number of times, for example a total of 2–5 times, to build up a silica nanolaminate structure forming the completed dielectric film. Process conditions are modulated following the initial layer of deposition to form a dielectric film layer having a surface roughness of, for example, no more than 2%, or no more than 1%. In various embodiments of the invention, conditions for forming a dielectric film layer having a low surface roughness may be achieved by manipulating one or more of a variety of process parameters during the deposition process. For example, conducting the formation of an initial layer of the laminate at a lower temperature (e.g., about 200° C.) and the subsequent layers at a higher temperature (e.g., about 230° C.) results in a nanolaminate film with reduced surface roughness. Modulation of other process conditions in combination with or as an alternative to the temperature modulation can also achieve the desired result.

Any suitable metal-containing precursor that can sufficiently adsorb onto the substrate surface and sufficiently react with the subsequently added silicon-containing precursor to form a dielectric layer that is more than a monolayer thick may be used. In general, the metals are transition metals. A preferred metal for the metal-containing precursor is aluminum. Other metal-containing precursors that can be deposited to activate or reactivate the catalytic surface include, but are not limited to, precursors containing zirconium, hafnium, gallium, titanium, niobium, tantalum, and their oxides or nitrides. Suitable aluminum-containing precursors include hexakis(dimethylamino)aluminum or trimethyl aluminum. Flow rates of aluminum-containing precursor gas can range broadly, e.g., between about 1 and 10000 sccm. Preferred flow rates of aluminum-containing precursor gas range between about 1 and 100 sccm.

Between operations, inert gas purges may be performed. Any suitable inert gas may be used. A typical purge lasts about 5 seconds. Additionally, there may be a post-deposition treatment to remove water from the deposited film.

In preferred embodiments of the invention, the substrate is a partially fabricated semiconductor wafer including shallow trench isolation (STI) features, over which the dielectric film is to be deposited.

Exposure to the aluminum-containing precursor and the silicon-containing precursor may occur in different chambers in preferred embodiments of the invention. Further, additional precursor gases may be used.

DETAILED DESCRIPTION OF SPECIFIC EMBODIMENTS

Figure 1:
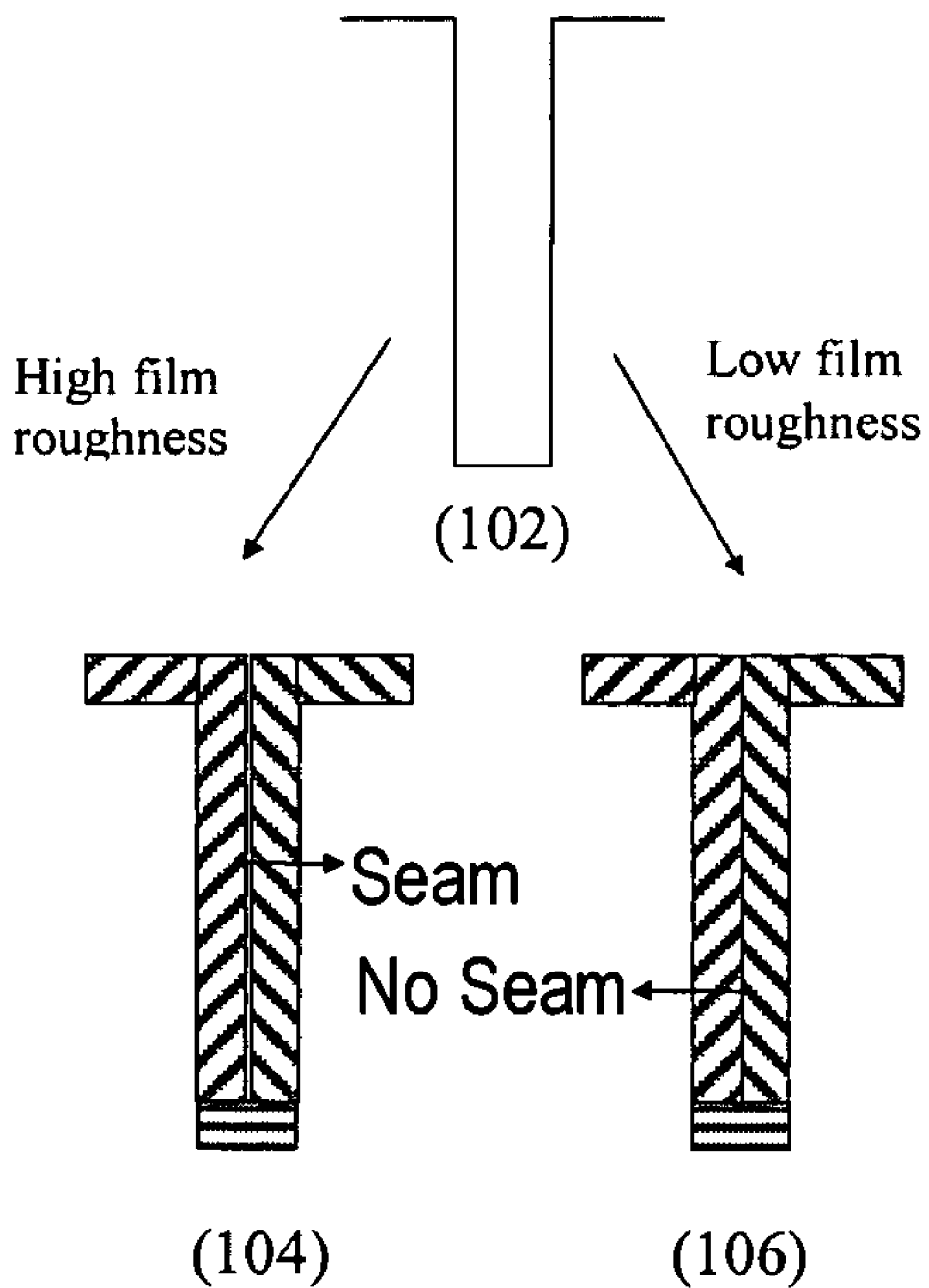
FIG. 1 is a schematic illustration of the effect film roughness on the quality of the film in filled trench deposited using static and dynamic process conditions.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides methods to greatly reduce or eliminate the surface roughness and thickness uniformity of thin deposited silica nanolaminate films. The present invention provides a method for using ALD and RVD techniques in semiconductor manufacturing to produce a smooth dielectric film, in particular for filling structures with doped or undoped silica glass. It relates to a process for depositing conformal nanolaminate silicon dioxide films, for example, for IMD, PMD, or STI gap fill applications. In gap fill applications, the conformal nature of the deposition process results in the formation of seams, which need to be eliminated to ensure device performance. The local film roughness of RVD, which can be modulated by deposition temperature and pressure is a contributing factor in the formation of seams in the layer. A dynamic process using variable temperature, reactor pressure and/or reactant partial pressure, as opposed to static process conditions through various cycles, can be used to minimize film roughness and improve gap fill performance and film properties via the elimination or reduction of seam occurrence. The process conditions between cycles may be changed in a gradual (e.g., gradient) manner over one or more cycles, or, more preferably in many embodiments, in a stepwise manner following deposition of the initial layer of the nanolaminate.

The present invention will now be described in detail, primarily with reference to RVD processes for the deposition component of the gap fill process. It should be understood that ALD processes may also by used for gap fill in accordance with the invention. Relevant details of ALD processes in general are described in M. Ritala and M. Leskela, "Atomic layer deposition", Chapter 2, Handbook of thin film materials, vol. 1, "Deposition and processing of thin films", Hari Singh Nalwa, Ed. (Academic Press, 2002). Given these details and the description provided herein, one of skill in the art would be able to implement the ALD aspect of the invention.

This method involves two principal operations: 1) exposing the substrate surface to a metal-containing precursor (e.g., a transition metal, such as aluminum, containing precursor for RVD) to form a substantially saturated surface of metal-containing precursor; and 2) exposing the substrate surface to a silicon-containing precursor. Operations 1) and 2) are repeated a number of times, for example a total of 2–5 times, to build up a silica nanolaminate structure forming the completed dielectric film. Process conditions are modulated following the initial layer of deposition to form a dielectric film layer having a surface roughness of, for example, no more than 2%, or no more than 1%. In various embodiments of the invention, conditions for forming a dielectric film layer having a low surface roughness may be achieved by manipulating one or more of a variety of process parameters during the deposition process. For example, conducting the formation of an initial layer of the laminate at a lower wafer (pedestal) temperature (e.g., about 200° C.) and the subsequent layers at a higher temperature (e.g., about 230° C.) results in a nanolaminate film with reduced surface roughness. Modulation of other process conditions in combination with or as an alternative to the temperature modulation can also achieve the desired result.

FIG. 1 illustrates the relative improvement in performance achieved by the method of the present invention in a gap fill application. Filling a high aspect ratio trench (102) using RVD techniques with static process conditions often results in the formation of a seam in the gap where the surfaces of the layers formed on facing sidewalls meet (104). This is believed to result from surface roughness of the film surface which prevents the facing surfaces from meeting without leaving a seam. Film surface roughness is believed to begin with the initially deposited layer in the nanolaminate dielectric film that is propagated through subsequently deposited layers of the nanolaminate.

Figure 2:
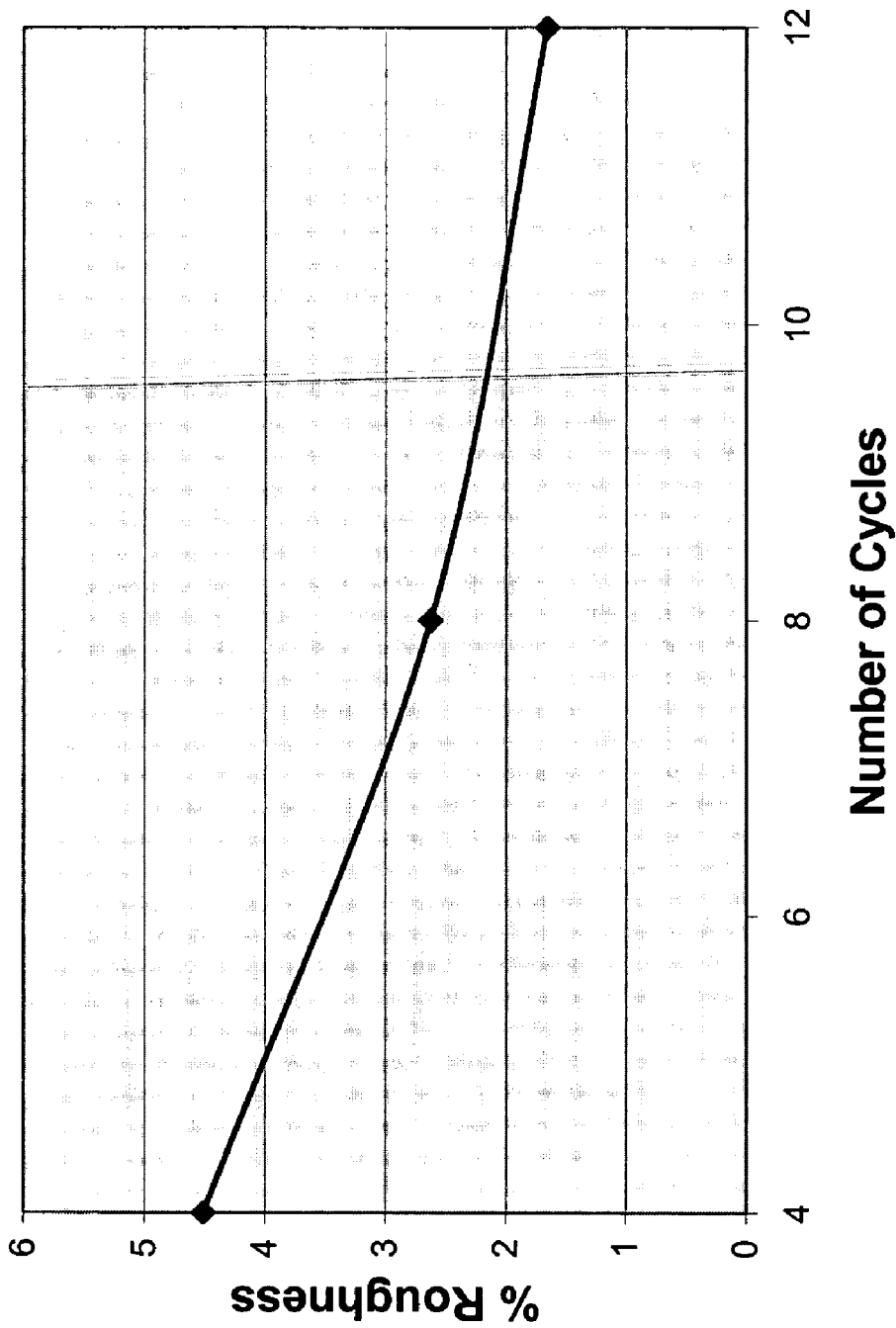
FIG. 2 is a plot of film roughness (RMS/total thickness) vs. number of process cycles.

This effect is illustrated in FIG. 2 which shows a plot of the film percent roughness (root mean square (RMS):total film thickness) as a function of the number of process cycles. Film roughness decreases as a function of the number of process cycles, indicating that the roughness of the initial layer(s) determines that of the film. It has been found that creating a smooth film growth template during the initial stages of nanolaminate deposition will result in lower film roughness and reduced or completely eliminated seams in trenches in gap fill applications (FIG. 1 (106)).

Overall film roughness can be reduced by operating the initial growth cycle under conditions which optimize film smoothness, and then switching to conditions that will enhance conformality, gap fill and film properties for the subsequent process cycles. Film deposition characteristics can be changed by modulating one or more of a number of process parameters including wafer temperature, reactor pressure, reactant partial pressure, and combinations of these. The process conditions between cycles may be changed in a gradual (e.g., gradient) manner over one or more cycles, or, more preferably in many embodiments, in a stepwise manner following deposition of the initial layer of the nanolaminate. In general, a slower deposition rate produces a smoother film. While a slow rate is inefficient, since the amount of material deposited during the first cycle is a small percentage of the total stack, the conditions for the first cycle can be selected to optimize smooth film growth at the expense of film formation rate without substantially adversely affecting overall process efficiency or the properties of the films formed.

Figure 3:
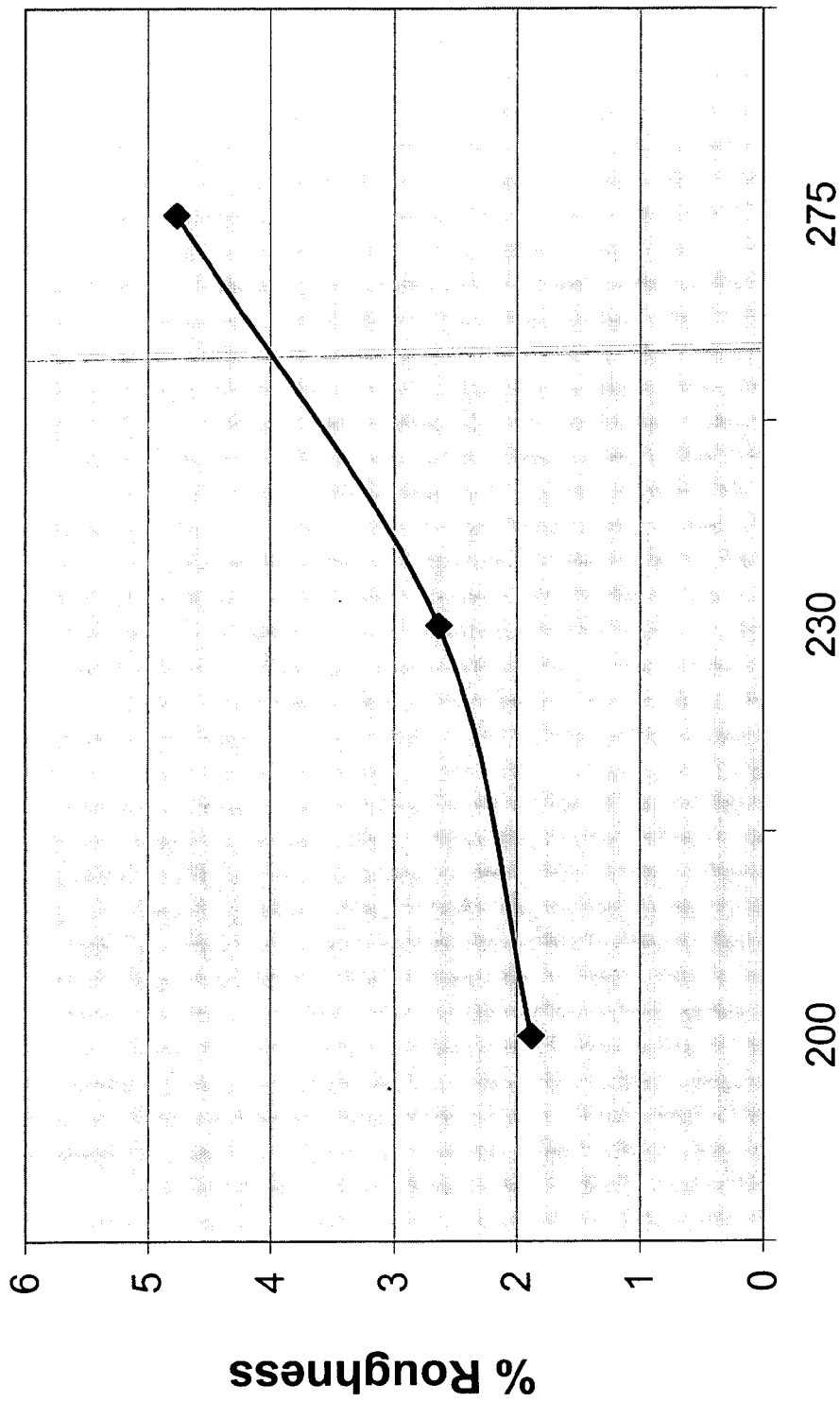
FIG. 3 illustrates the effect of wafer temperature on film roughness.
Figure 4:
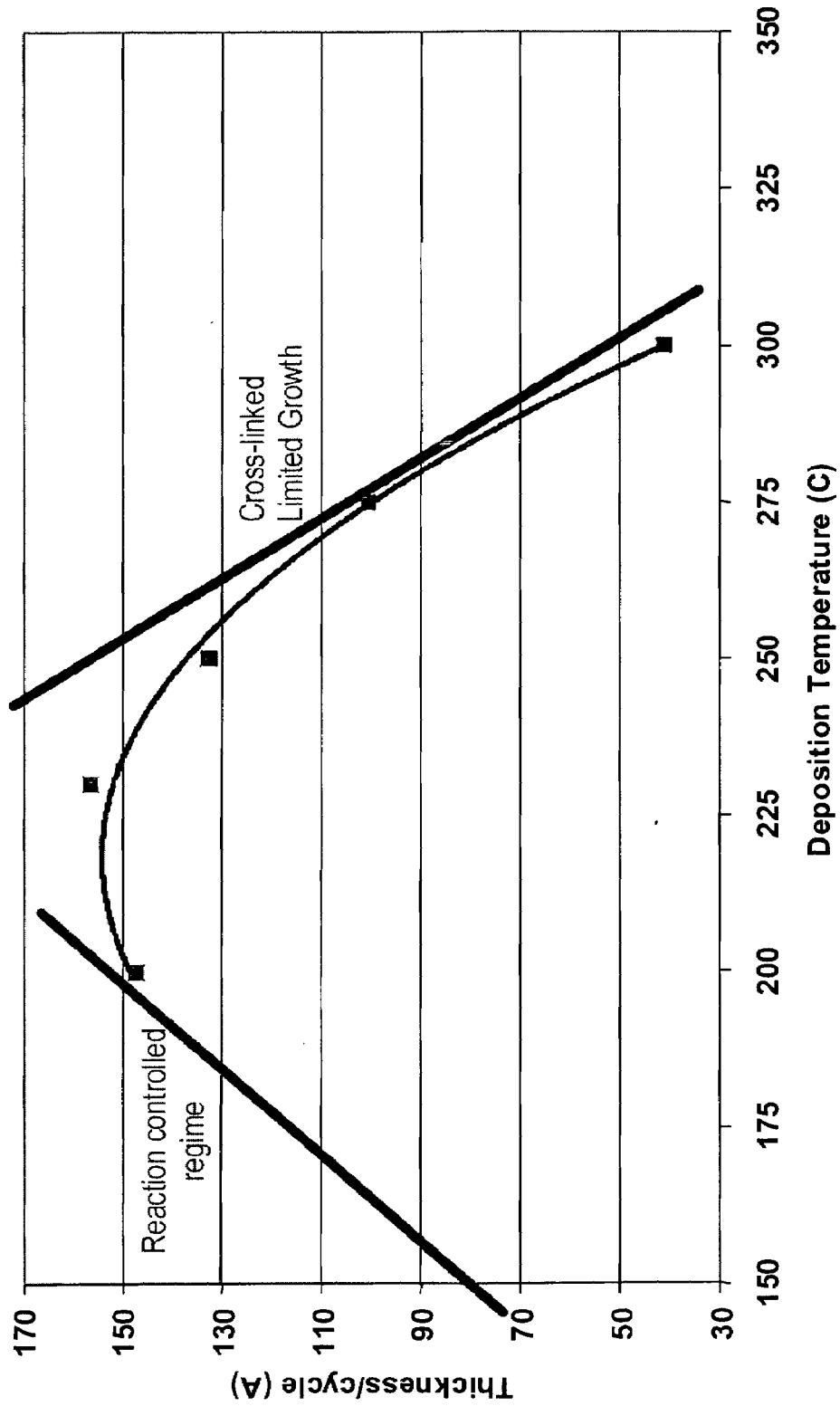
FIG. 4 illustrates the effect of wafer temperature on film growth rate.

FIG. 3 illustrates the effect of wafer temperature on film roughness. The plot shows that film roughness, typically measured by AFM (atomic force microscopy), increases with increasing temperature, producing a relatively smooth film, having roughness of less than 2%, at 200° C., a moderately rough film of about 2.5% roughness at 230° C., and a much rougher film, almost 5%, at 275° C. The low roughness regime shown in FIG. 3 corresponds to the lower temperature low rate (thickness/cycle) regime shown in FIG. 4. While the invention is not limited by this theory, these results suggest that low growth rate due to low reactivity allows for the molecules to rearrange and yield smoother films.

Once an initial smooth film layer is formed, subsequently deposited layers of the nanolaminate films can be deposited using conditions optimized for deposition that conforms to this initial smooth layer. As noted above, these conformal deposition conditions are generally associated with higher deposition rates, which enhances the speed and efficiency and, therefore, the throughput of the overall film formation process.

The invention is primarily described and exemplified herein with reference to the wafer temperature and the modulated process condition in the dynamic deposition process. However, varying process temperature between process steps is only one of many possible approaches. Other process parameters (listed above) can be ramped separately or simultaneously. For example:

Relatively low partial pressure of the silicon-containing precursor gas (e.g., 1–3 Torr, for example about 2 Torr) for the initial deposition stage(s) limits deposition rate and results in deposition of a smooth film. Subsequent deposition stages using modulated process conditions in which the partial pressure of the silicon-containing precursor gas is adjusted upward (e.g., to about 10–25 Torr, for example about 10 Torr) results in more rapid, conformal deposition to complete the nanolaminate film.

It should be understood that the noted process conditions may be modulated alone or in combinations to achieve the benefits of the present invention.

RVD Embodiment

Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired film thickness is achieved, the flow of B is stopped and the reaction is halted. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques. However, in CVD, the chemical reactant gases are simultaneously introduced in a reaction chamber and allowed to mix and chemically react with each other in gas phase. The products of the homogeneous reactions are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions.

Another deposition technique related to RVD is atomic layer deposition (ALD). RVD and ALD are both surface-controlled reactions involving alternately directing the reactants over a substrate surface. Conventional ALD, however, depends on self-limiting typically monolayer producing reactions for both reactant gases. As an example, if reactants C and D are first and second reactant gases for an ALD process, after C is adsorbed onto the substrate surface to form a saturated layer, D is introduced and reacts only with adsorbed C. In this manner, a very thin and conformal film can be deposited. In RVD, as previously described using exemplary reactants A and B, after A is adsorbed onto the substrate surface, B reacts with adsorbed A and is further able to react to accumulate a self-limiting, but much thicker than one monolayer film. Thus, as stated previously, the RVD process allows for rapid film growth similar to using CVD methods but with the conformality of ALD type methods. In the RVD aspect of the present invention, this further accumulation of film is accomplished by a catalytic polymerization, which will be discussed in detail further.

The differences between conventional ALD and RVD film formation are principally due to the difference between the thicknesses of the films formed after the completion of each type of process and arise from the nature of the metal-containing species used in the initial layer. In ALD, a single exposure to the metal-containing precursor leads to the formation of a monolayer of the product film (generally less than 5 Å thick), while in RVD, the metal-containing precursor catalyzes formation of more than a monolayer of silica film. The typical growth is greater than 150 Å/cycle. Typically, a silica RVD process utilizes trimethyaluminum (TMAl) as the process aluminum precursor.

Figure 5:
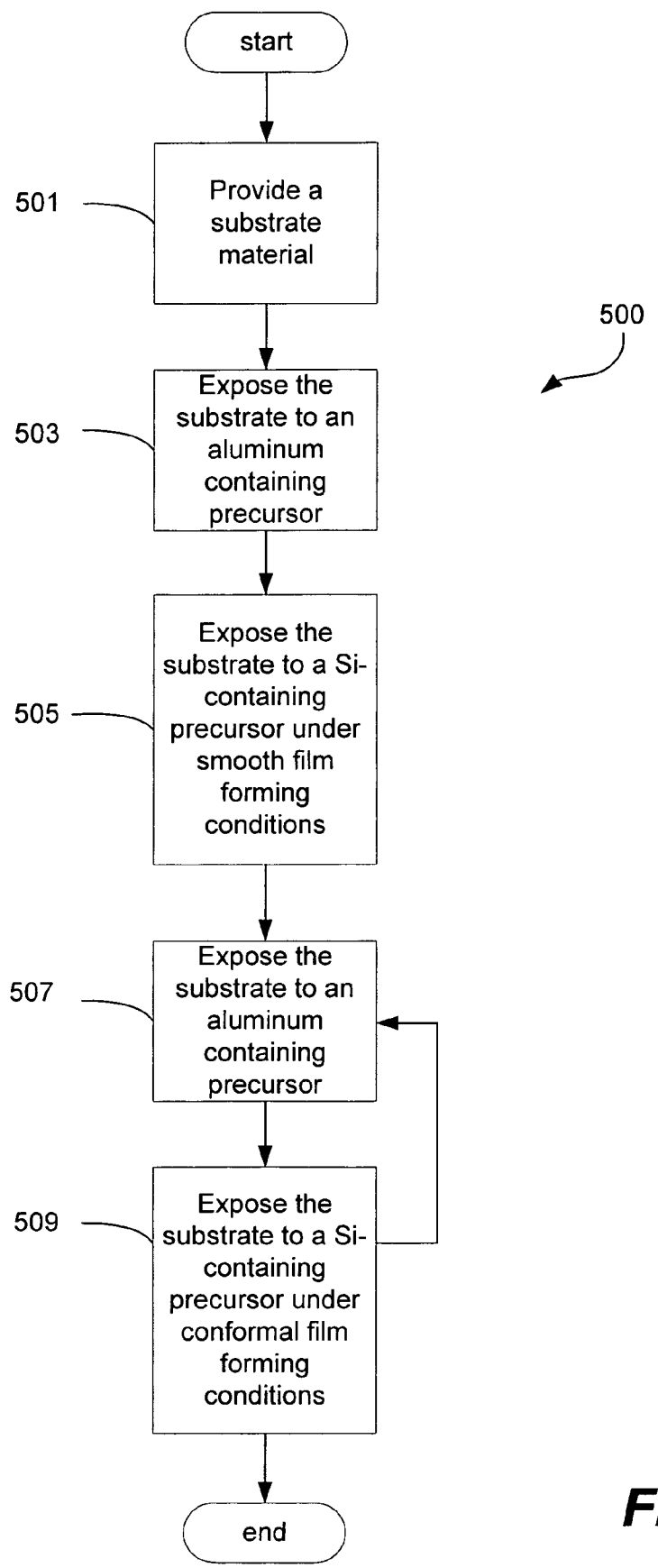
FIG. 5 a process flow diagram illustrating relevant operations employing rapid vapor deposition (RVD) to form a smooth nanolaminate dielectric film in accordance with the present invention.

FIG. 5 is a process flow diagram illustrating relevant operations in a rapid vapor deposition (RVD) process to form a nanolaminate dielectric film in accordance with the present invention.

The deposition process 500 begins with operation 501, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications, such as filling of STI or PMD features.

The process continues with operation 503, where a metal (the example of aluminum is used in the present description in accordance with a preferred embodiment)-containing precursor gas is pumped into the deposition chamber so as to substantially saturate the surface with the aluminum-containing precursor. Any suitable aluminum-containing precursor that can sufficiently adsorb onto the substrate surface and sufficiently react with the subsequently added silicon-containing precursor may be used. In addition, the aluminum-containing precursor should be capable of aiding the catalytic polymerization of the subsequently added silicon-containing precursor to produce a film thicker than a monolayer. In preferred embodiments, for example, hexakis (dimethylamino)aluminum $(Al_2(N(CH_3)_2)_6)$ or trimethylaluminum $(Al(CH_3)_3)$ are used. Other suitable aluminum-containing precursors include, for example, triethylaluminum $(Al(CH_2CH_3)_3)$ or aluminum trichloride $(AlCl_3)$.

Note that any suitable metal containing precursor that can sufficiently adsorb onto the substrate surface and sufficiently react with the subsequently added silicon-containing precursor to form a dielectric layer that is more than a monolayer thick may be used in place of the aluminum-containing precursor. In general, the metal is a transition metal. Other metal-containing precursors that can be deposited to reactivate the catalytic surface include, but are not limited to, zirconium, hafnium, gallium, titanium, niobium, tantalum, and their oxides or nitrides.

As indicated earlier, forming a saturated layer is a self-limiting process and to a certain extent independent of process conditions. Relevant process conditions can include substrate (e.g., wafer) temperature, reactor pressure, reactant partial pressure, and combinations thereof. Pressures can range broadly, e.g., between about 1 mTorr and 760 Torr. Typical pressures range between about 500 and 1250 mTorr and typical temperatures range between about 200 and 300 degrees Celsius. Flow rates of aluminum-containing precursor gas can range broadly, e.g., between about 1 and 10000 sccm. Preferred flow rates of aluminum-containing precursor gas range between about 1 and 100 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 2 seconds is found to be sufficient.

After a saturated layer of aluminum-containing precursor is formed, an inert gas is preferably used to purge the substrate surface and reaction chamber (not shown). It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Returning to FIG. 5, following the chamber purge, the aluminum saturated substrate surface is exposed to a silicon-containing precursor gas under conditions selected for growth of a smooth dielectric film, e.g., a film having a surface roughness of no more than 2%, or no more than 1%, in operation 505. Suitable initial process conditions are noted above. In one preferred embodiment, a wafer temperature of about 200° C. is used for the deposition of the initial layer of the nanolaminate dielectric film.

Any suitable silicon-containing precursor that can sufficiently adsorb onto and react with the saturated layer of aluminum-containing precursor to form a dielectric film may be used. In addition, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol $((C_4H_9O)_3SiOH)$, tris(tert-pentoxy)silanol $((C_5H_{11}O)_3SiOH)$, di(tert-butoxy)silandiol $((C_4H_9O)_2Si(OH)_2)$ and methyl di(tert-pentoxy)silanol.

While the invention is not limited to this theory of operation, as mentioned previously, it is believed that the accumulation of dielectric film is achieved via a polymerization process. The saturated layer of aluminum precursor (e.g., Al or $Al_2O_3$) can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon-containing precursor is exposed to the saturated layer of aluminum atoms. The film can also be made thicker by repeating the number of precursor deposition cycles. Studies regarding these finding can be found in the doctoral thesis of Dennis Hausmann, Harvard University, (2002).

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. As noted, the process conditions in accordance with the present invention are dynamic, at first selected to optimize surface smoothness, then selected to optimize conformality and deposition rate. Generally, temperatures can range from about 200 to 300° C. A typical initial deposition temperature is about 200° C.; and 230° C. for subsequent deposition stages. Pressures can range broadly, e.g., between about 1 mTorr and 760 Torr. Typical pressures range between about 500 mTorr and 20 Torr. Flow rates of silicon-containing precursor gas can range broadly, e.g., between about 1 and 10000 sccm. Preferred flow rates of silicon-containing precursor gas range between about 200 and 1000 sccm. The dose of silicon-containing precursor can range broadly, e.g., between about 0.001 milligrams and 100 grams. Typical silicon-containing precursor doses range between about 0.1 and 0.3 grams. Exposure times can range broadly, e.g., between about 1 milliseconds and 100 seconds. Preferred exposure times typically range between about 1 and 10 seconds. The number of separate exposures to silicon-containing precursor will primarily depend upon the desired final film thickness. Typical numbers of silicon-containing precursor exposure cycles for a STI feature 0.1 micron in diameter range between about 4 and 7. Again, as with the temperature process condition, these other process conditions may be modulated alone or in combinations in the dynamic process of the invention in accordance with the parameters noted above.

Referring back to FIG. 5, after exposure to a silicon-containing precursor and formation of an initial dielectric film layer, subsequent cycles of the process are conducted using modulated process conditions selected to promote high rate conformal deposition until a desired thickness is achieved. For many STI applications, for example, the total film thickness ranges between about 500 and 1000 Å. Thus, operation 505 is followed by operation 507, wherein the substrate surface is again exposed to an aluminum-containing precursor gas, and operation 509 wherein the aluminum saturated substrate surface is exposed to a silicon-containing precursor gas under conditions selected conformal, and generally high rate, growth of a dielectric film. Suitable subsequent process conditions are noted above. In one preferred embodiment, a wafer temperature of about 230° C. is used for the deposition of the subsequent layers of the nanolaminate dielectric film. The smoothness of the initial layer is propagated through the subsequently deposited conformal layers so that a smooth film of the desired final thickness is efficiently achieved. Operations 507 and 509 are optionally repeated (per the arrow in FIG. 5) until a desired thickness of dielectric material has been reached, e.g., a gap has been filled. Typically, each RVD cycle deposits about 150 Å of material. In one embodiment the process generally involves 3–5 cycles to fill a gap.

OTHER EMBODIMENTS

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (e.g., more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of $SiO_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous getterer as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." A similar approach can be implemented for controlling the roughness of alumina layers deposited by the ALD reaction of trimethyl aluminum and water. The above-referenced applications are incorporated by reference in their entirety for all purposes.

Apparatus

Figure 6:
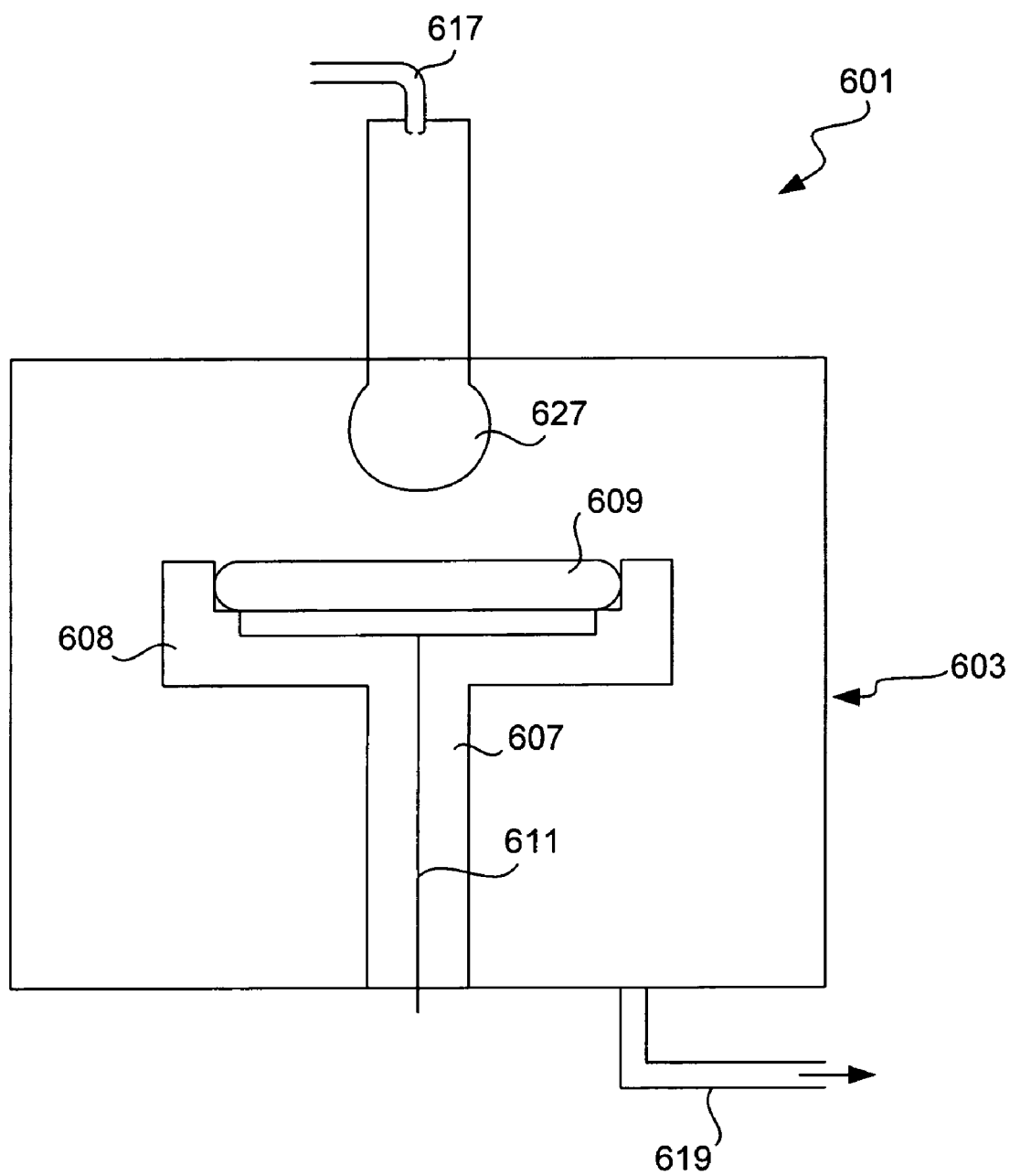
FIG. 6 is a schematic diagram showing the basic features of a RVD reactor module suitable for practicing the current invention.

FIG. 6 is a block diagram depicting some components of a suitable reactor for performing dielectric deposition using a RVD process in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 601 includes a process chamber 603, which encloses components of the reactor and serves to contain the reactant gases and provide and area to introduce the reactant gases to substrate 609. The chamber walls may be made of or plated with any suitable material, generally a metal that is compatible with the deposition and associated processes conducted therein. In one example, the process chamber walls are made from aluminum. Within the process chamber, a wafer pedestal 607 supports a substrate 609. The pedestal 607 typically includes a chuck 608 to hold the substrate in place during the deposition reaction. The chuck 608 may be an electrostatic chuck, a mechanical chuck or various other types of chuck as are available for use in the industry and/or research.

A heat transfer subsystem including resistive heaters and/or lines 611 for supplying a heat transfer fluid to the pedestal 607 controls the temperature of pedestal 607. In some embodiments, the heat transfer fluid comprises water or another liquid. The reactant gases, as well as inert gases during purge, are introduced individually into the reactor via inlet 617. A showerhead 627 may be used to distribute the gas flow uniformly in the process reactor. Reactant gases are introduced through a gas supply inlet mechanism including orifices. There may be multiple reactant gas tubes and inlets. A vacuum pump connected to outlet 619 can draw out gases between RVD cycles.

Various details of the apparatus have been omitted for clarity's sake, and various design alternatives may be implemented.

EXAMPLE

The following example provides details relating to performance advantages of the present invention. It should be understood the following is representative only, and that the invention is not limited by the detail set forth in this example.

Figure 7:
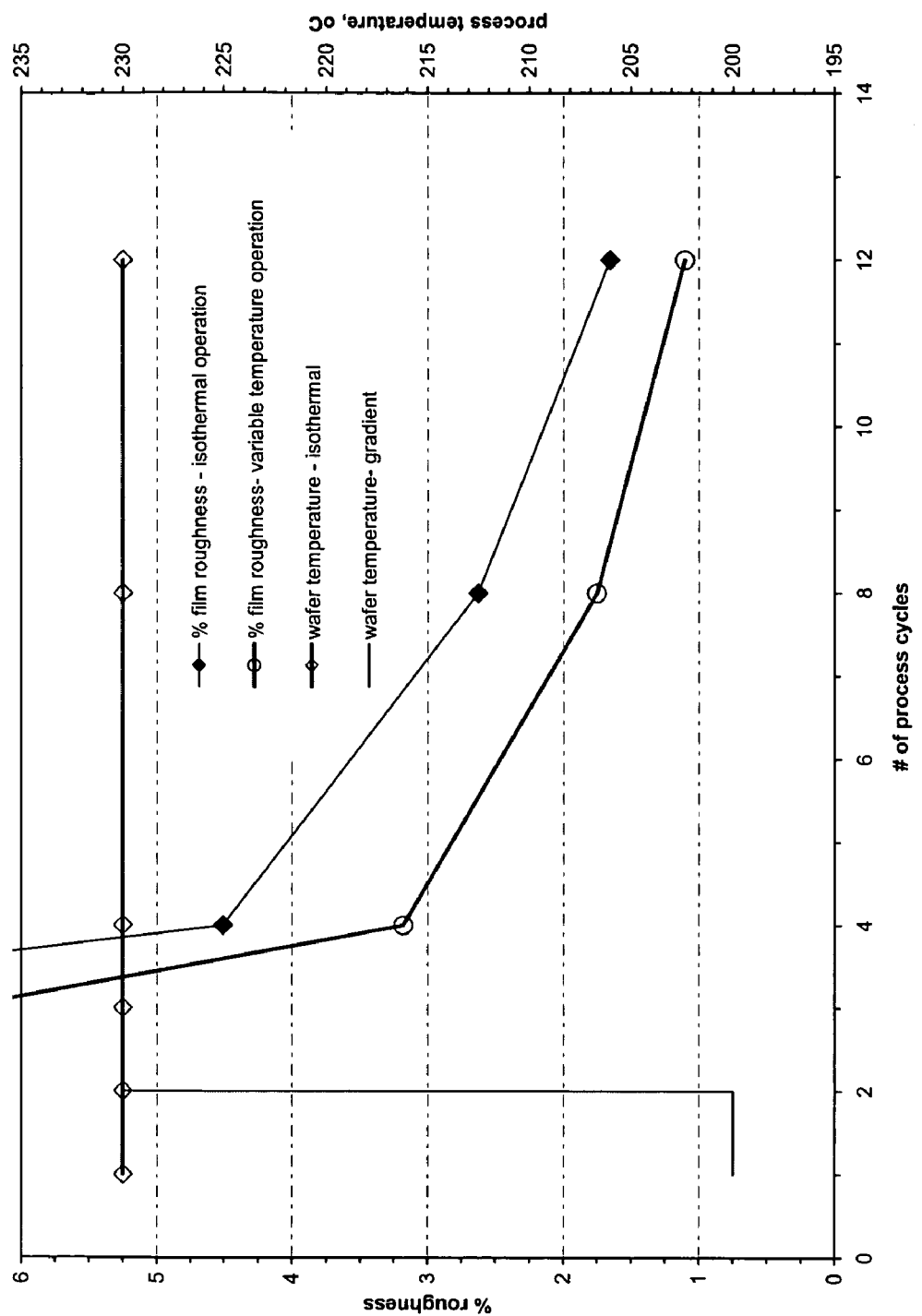
FIG. 7 is a plot of a comparison of process conditions and results for nanolaminate dielectric film deposition using static (isothermal) versus dynamic wafer temperature conditions.

The roughness of a deposited nanolaminate dielectric film deposited using dynamic process conditions versus a film deposited using static process conditions was compared. The first dielectric film was formed by depositing the first layer of the nanolaminate at a lower temperature of 200° C. and the rest (up to 12 layers) at a higher temperature, 230° C. in this example. The second dielectric film was formed using static process conditions (i.e., in this instance, isothermal conditions). FIG. 7 illustrates a plot of percent roughness and process temperature versus the number of process cycles for both films for comparison. A substantial improvement in film roughness, about 30%, is observed for the film formed using dynamic process conditions. Thus, the data demonstrate that by using dynamic process conditions (e.g., wafer temperature), selected to minimize surface roughness initially and optimize conformality subsequently, a dielectric film with a substantially lower final surface roughness relative to a nanolaminate dielectric film for which the process conditions is kept static is obtained.

CONCLUSION

The disclosed method applies to the gap fill deposition of silica nanolaminates using the rapid vapor deposition (RVD) process, also sometimes referred to as the pulsed deposition layer (PDL) process. This method can be used to prevent the occurrence of seams in the material deposited in trenches and improve gap fill performance. It pertains to IMD, STI and PMD applications. While described primarily with reference to silicon dioxide herein, the method may also be used for depositing doped silica films, such as FSG, PSG, BPSG, or carbon doped low-k materials.

Although the foregoing invention has been described in some detail for purposes of clarity of understanding, it will be apparent that certain changes and modifications may be practiced within the scope of the appended claims. It should be noted that there may be alternative ways of implementing the present invention. For example, while the invention has been described primarily with reference to a RVD embodiment herein, the invention is also applicable to other multi-step chemical deposition techniques, such as ALD. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

It is claimed:

1. A method of forming a silica nanolaminate dielectric film, the method comprising:
   forming a first layer of the silica nanolaminate dielectric film under process conditions selected to promote smoothness by a process comprising,
   (a) exposing a substrate surface to a metal-containing precursor gas to form a saturated layer of metal-containing precursor on the substrate surface, and
   (b) exposing the substrate surface to a silicon-containing precursor gas;
   wherein the first layer formed has a surface roughness of no more than 2%; and
   forming on the first layer an additional layer of the silica nanolaminate dielectric film under process conditions selected to promote conformality by a process comprising,
   (c) exposing the substrate surface to the metal-containing precursor gas to form a second saturated layer of metal-containing precursor on the first layer, and
   (d) exposing the substrate surface to the silicon-containing precursor gas;
   whereby the silica nanolaminate film is formed.

2. The method of claim 1, further comprising repeating (c) and (d) at least once.

3. The method of claim 1, wherein the dielectric is deposited over a gap to be filled.

4. The method of claim 1, wherein the process conditions comprise conditions selected from the group consisting of wafer temperature, reactor pressure, reactant partial pressure, and combinations thereof.

5. The method of claim 1, wherein the process conditions comprise optimized wafer temperatures.

6. The method of claim 5, wherein the wafer temperature for the first formed layer is about 200° C.

7. The method of claim 6, wherein the wafer temperature for the additional formed layer is about 230° C.

8. The method of claim 1, wherein the process conditions comprise optimized silicon-containing precursor reactant gas partial pressures.

9. The method of claim 8, wherein the partial pressure for the first formed layer is about 2 Torr.

10. The method of claim 9, wherein the partial pressure for the additional formed layer is about 10 Torr.

11. The method of claim 1, wherein the metal-containing precursor reacts with the silicon-containing precursor to form a monolayer.

12. The method of claim 1, wherein the metal-containing precursor catalyzes formation of more than a monolayer of silicon-containing precursor.

13. The method of claim 1, wherein the substrate is a partially fabricated semiconductor wafer.

14. The method in claim 13, wherein the dielectric film is deposited over gaps in the partially fabricated semiconductor wafer.

15. The method in claim 14, wherein the dielectric film is deposited over a feature selected from the group consisting of shallow trench isolation (STI), inter-metal dielectric (IMD), inter-level dielectric (ILD), and pre-metal dielectric (PMD) features in the partially fabricated semiconductor wafer.

16. The method of claim 1, wherein the metal-containing precursor comprises a transition metal.

17. The method of claim 16, wherein the transition metal is aluminum.

18. The method of claim 17, wherein the metal-containing precursor is at least one of hexakis(dimethylamino)aluminum and trimethyl aluminum.

19. The method of claim 1, wherein the silicon-containing precursor is at least one of a silanol and a silanediol.

20. The method of claim 1, wherein the silicon-containing precursor is at least one of tris(tert-butoxy)silanol (($C_4H_9O$)$_3$SiOH) and tris(tert-pentoxy)silanol(($C_5H_{11}O$)$_3$SiOH).

21. A method of filling a gap on a partially formed semiconductor wafer a nanolaminate dielectric film, the method comprising:
   (a) exposing the wafer surface to an aluminum-containing precursor gas to form a saturated layer of aluminum-containing precursor on the substrate surface;
   (b) exposing the wafer surface to a silicon-containing precursor gas to form a first layer of the nanolaminate dielectric film, wherein the wafer temperature is about 200° C.;
   (c) exposing the wafer surface to the aluminum-containing precursor gas to form a second saturated layer of the aluminum-containing precursor on the wafer surface; and
   (d) exposing the wafer surface to the silicon-containing precursor gas to form one or more additional layers of the nanolaminate dielectric film until the gap is filled, wherein the wafer temperature is about 230° C.

22. The method of claim 21, wherein the metal-containing precursor is trimethyl aluminum.

23. The method of claim 22, wherein the silicon-containing precursor is tris(tert-butoxy)silanol (($C_4H_9O$)$_3$SiOH).

24. A method of forming a nanolaminate dielectric film, the method comprising:
   forming a first layer of the nanolaminate dielectric film under process conditions selected to promote smoothness by a process comprising,
   (a) exposing a partially fabricated semiconductor wafer surface comprising a feature selected from the group consisting of shallow trench isolation (STI), inter-metal dielectric (IMD), inter-level dielectric (ILD) and premetal dielectric (PMD), having gaps to a metal-containing precursor gas to form a saturated layer of metal-containing precursor on the wafer surface, and (b) exposing the wafer surface to a silicon-containing precursor gas; and forming on the first layer an additional layer of the nanolaminate dielectric film under process conditions selected to promote conformality by a process comprising, (c) exposing the wafer surface to the metal-containing precursor gas to form a second saturated layer of metal-containing precursor on the first layer, and (d) exposing the wafer surface to the silicon-containing precursor gas;

whereby the nanolaminate film is formed over the gaps in the partially fabricated semiconductor wafer surface.

25. The method of claim 24, further comprising repeating (c) and (d) at least once.

26. The method of claim 24, wherein the first layer formed has a surface roughness of no more than 2%.

27. The method of claim 24, wherein the process conditions comprise conditions selected from the group consisting of wafer temperature, reactor pressure, reactant partial pressure, and combinations thereof.

28. The method of claim 24, wherein the process conditions comprise optimized wafer temperatures.

29. The method of claim 28, wherein the wafer temperature for the first formed layer is about 200° C.

30. The method of claim 29, wherein the wafer temperature for the additional formed layer is about 230° C.

31. The method of claim 24, wherein the process conditions comprise optimized silicon-containing precursor reactant gas partial pressures.

32. The method of claim 31, wherein the partial pressure for the first formed layer is about 2 Torr.

33. The method of claim 32, wherein the partial pressure for the additional formed layer is about 10 Torr.

34. The method of claim 24, wherein the metal-containing precursor is at least one of hexakis(dimethylamino)aluminum and trimethyl aluminum.

35. The method of claim 24, wherein the silicon-containing precursor is at least one of a silanol and a silanediol.

36. The method of claim 34, wherein the silicon-containing precursor is at least one of tris(tert-butoxy)silanol (($C_4H_9O)_3SiOH$) and tris(tert-pentoxy)silanol(($C_5H_{11}O)_3SiOH$).

* * * * *

UNITED STATES PATENT AND TRADEMARK OFFICE
CERTIFICATE OF CORRECTION

PATENT NO. : 7,223,707 B1 Page 1 of 1
APPLICATION NO. : 11/027480
DATED : May 29, 2007
INVENTOR(S) : Papasouliotis et al.

It is certified that error appears in the above-identified patent and that said Letters Patent is hereby corrected as shown below:

In the Title Page:

In the section (56) References Cited, under "U.S. Patent Documents", add:

| | | |
|---|---|---|
| --6,624,091 | 09/2003 | Yuan, Zheng |
| 6,903,005 | 06/2005 | Marsh, Eugene P. |
| 6,984,591 | 01/2006 | Buchanan et al. |
| 2004/0025787 | 02/2004 | Selbrede et al. |
| 2004/0247787 | 12/2004 | Mackie et al. |
| 2006/0127578 | 06/2006 | Lei et al.-- |

In the section (56) References Cited, under "Other Documents", add:

--U.S. Office Action mailed September 27, 2006, from U.S. Appl. No. 11/026,284.

U.S. Office Action mailed July 7, 2006, from U.S. Appl. No. 10/875,158.

U.S. Office Action mailed September 27, 2006, from U.S. Appl. No. 11/021,558.--

Signed and Sealed this

Sixth Day of May, 2008

JON W. DUDAS
*Director of the United States Patent and Trademark Office*